(12) United States Patent
deVilliers et al.

(10) Patent No.: US 11,049,700 B2
(45) Date of Patent: Jun. 29, 2021

(54) ATMOSPHERIC PLASMA PROCESSING SYSTEMS AND METHODS FOR MANUFACTURE OF MICROELECTRONIC WORKPIECES

(71) Applicant: Tokyo Electron Limited, Tokyo (JP)

(72) Inventors: Anton J. deVilliers, Clifton Park, NY (US); Mirko Vukovic, Slingerlands, NY (US); Brandon Byrns, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/719,294

(22) Filed: Sep. 28, 2017

(65) Prior Publication Data
US 2018/0096827 A1    Apr. 5, 2018

Related U.S. Application Data

(60) Provisional application No. 62/402,606, filed on Sep. 30, 2016.

(51) Int. Cl.
*H01J 37/32* (2006.01)
*H01L 21/67* (2006.01)
(Continued)

(52) U.S. Cl.
CPC .... *H01J 37/32825* (2013.01); *H01J 37/3244* (2013.01); *H01J 37/32183* (2013.01);
(Continued)

(58) Field of Classification Search
CPC ............ H01J 37/32825; H01J 37/3244; H01J 37/32541; H01J 37/32715;
(Continued)

(56) References Cited

U.S. PATENT DOCUMENTS 5,221,427 A * 6/1993 Koinuma ................ B29C 59/14
                                                         156/345.46
6,137,231 A   10/2000 Anders et al.
(Continued)

FOREIGN PATENT DOCUMENTS

CN          102820204 A  * 12/2012  ............. G03F 7/427
WO     WO 03/046970 A1     6/2003

OTHER PUBLICATIONS

English Machine Translation of Han et al. CN102820204 retrieved from ESPACENET Oct. 18, 2018 (Year: 2012).*

(Continued)

*Primary Examiner* — Rakesh K Dhingra
*Assistant Examiner* — Laureen Chan
(74) *Attorney, Agent, or Firm* — Oblon, McClelland, Maier & Neustadt, L.L.P.

(57) ABSTRACT

Systems and related methods are disclosed for atmospheric plasma processing of microelectronic workpieces, such as semiconductor wafers. For disclosed embodiments, a radio frequency (RF) generator generates an RF signal that is distributed to one or more plasma sources within a process chamber. The process chamber has an atmospheric pressure between 350 to 4000 Torr. The plasma sources are then scanned across a microelectronic workpiece to apply plasma gasses generated by the plasma generators to the microelectronic workpiece. The plasma sources can be individually scanned and/or combined in arrays for scanning across the microelectronic workpiece. Linear and/or angular movement can be applied to the plasma sources and/or the microelectronic workpiece to provide the scanning operation. Various implementations are disclosed.

6 Claims, 4 Drawing Sheets

(51) Int. Cl.
*H01L 21/687* (2006.01)
*H05H 1/46* (2006.01)
*H01L 21/3065* (2006.01)

(52) U.S. Cl.
CPC .. *H01J 37/32541* (2013.01); *H01J 37/32715* (2013.01); *H01L 21/3065* (2013.01); *H01L 21/67069* (2013.01); *H01L 21/68764* (2013.01); *H05H 1/46* (2013.01); *H01J 2237/20214* (2013.01); *H01J 2237/334* (2013.01); *H05H 2001/4682* (2013.01)

(58) Field of Classification Search
CPC ....... H01J 37/32183; H01J 2237/20214; H01J 2237/334; H01J 37/321; H01J 37/32577; H01L 21/68764; H01L 21/67069; H01L 21/3065; H01P 5/12; H03H 7/48; H05H 1/24; H05H 2001/3431; H05H 1/36; H05H 1/26; H05H 1/46; H05H 2001/4682
See application file for complete search history.

(56) References Cited

U.S. PATENT DOCUMENTS

| | | | |
|---|---|---|---|
| 6,140,773 | A | 10/2000 | Anders et al. |
| 6,388,381 | B2 | 5/2002 | Anders |
| 2002/0000779 | A1 | 1/2002 | Anders |
| 2002/0134508 | A1* | 9/2002 | Himori ............. H01J 37/32082 156/345.44 |
| 2007/0228008 | A1 | 10/2007 | Wolfe et al. |
| 2008/0127892 | A1 | 6/2008 | Kim |
| 2009/0140828 | A1* | 6/2009 | Shannon ........... H01J 37/32091 333/235 |
| 2011/0025430 | A1* | 2/2011 | Ellingboe ................. H01P 5/12 333/124 |
| 2014/0262789 | A1* | 9/2014 | Shannon ................... C02F 1/46 204/554 |
| 2015/0042017 | A1* | 2/2015 | Ramaswamy ........ C23C 16/513 264/446 |
| 2015/0371832 | A1* | 12/2015 | Yanai ................ H01L 21/67028 438/714 |

OTHER PUBLICATIONS

Finucane, Edward W.. (2006). Definitions, Conversions, and Calculations for(3rd Edition)—1.1.4.3 Ventilation-Based Standard Air. Taylor & Francis. (Year: 2006).*

Cleveland, Cutler J. Morris, Christopher.(2006). Dictionary of Energy—Global Warming, (pp. 197). Elsevier. (Year: 2006).*

Byrns, Brandon Raye. Design and Characterization of a Coaxial VHF Plasma Source for Use in Atmospheric Applications. 2014. North Carolina State University PhD Dissertation, pp. 17-18, 52, 57-58, 74-75, 77, 85-86, 93-95, 135 (Year: 2014).*

International Search Report and Written Opinion dated Jan. 12, 2018 in PCT/US2017/054119, 10 pages.

* cited by examiner

ATMOSPHERIC PLASMA PROCESSING SYSTEMS AND METHODS FOR MANUFACTURE OF MICROELECTRONIC WORKPIECES

RELATED APPLICATIONS

This application claims priority to the following co-pending provisional application: U.S. Provisional Patent Application Ser. No. 62/402,606, filed Sep. 30, 2016, and entitled "ATMOSPHERIC PLASMA MODULE FOR WAFER ETCHING ON A COATER-DEVELOPER," which is hereby incorporated by reference in its entirety.

BACKGROUND

The present disclosure relates to semiconductor fabrication including processing of microelectronic workpieces, such as semiconductor wafers. Semiconductor fabrication involves a series of manufacturing techniques related to the formation, patterning and removal of a number of layers of material on a substrate. Plasma processing is one technique commonly used to deposit materials onto surfaces of microelectronic workpieces and to etch materials from surfaces of microelectronic workpieces. Typically, such plasma processing requires process chambers with low-pressure or vacuum environments. The depressurizing and re-pressurizing of these process chambers to achieve the low-pressure or vacuum environments adds expense and time to the manufacturing process.

SUMMARY

Systems and related methods are disclosed for atmospheric plasma processing of microelectronic workpieces, such as semiconductor wafers. For disclosed embodiments, a radio frequency (RF) generator generates an RF signal that is distributed to one or more plasma sources within a process chamber. The process chamber has an atmospheric pressure between 350 to 4000 Torr. The plasma sources are then scanned across a microelectronic workpiece to apply plasma gasses generated by the plasma generators to the microelectronic workpiece. The plasma sources can be individually scanned and/or combined in arrays for scanning across the microelectronic workpiece. Linear and/or angular movement can be applied to the plasma sources and/or the microelectronic workpiece to provide the scanning operation. Additional features and variations can be implemented, if desired, and related systems and methods can be utilized, as well.

For one embodiment, a method to process a microelectronic workpiece is disclosed including generating a radio frequency (RF) signal, distributing the RF signal to one or more plasma sources within a process chamber having an atmospheric pressure where the atmospheric pressure is between 350 to 4000 Torr, and scanning the one or more plasma sources across a microelectronic workpiece to apply plasma gasses generated by the one or more plasma sources to the microelectronic workpiece.

In additional embodiments, the microelectronic workpiece includes a semiconductor wafer. In further embodiments, the method includes rotating the microelectronic workpiece with respect to the one or more plasma sources to scan the one or more plasma sources with respect to a microelectronic workpiece.

In additional embodiments, the one or more plasma sources are a plurality of plasma sources connected together as an array of plasma sources. In further embodiments, the scanning includes linearly moving the array of plasma sources with respect to the microelectronic workpiece. In still further embodiments, the scanning further includes rotating the microelectronic workpiece with respect to the array of plasma sources.

In additional embodiments, each of the one or more plasma sources includes an outer conductor, an inner conductor, and a dielectric material positioned between the outer conductor and the inner conductor. In further embodiments, for each plasma source, the method includes connecting a ground to the outer conductor and the inner conductor at a first end of the plasma source and connecting the RF signal to the inner electrode to drive an electrode coupled to the inner conductor at a second end of the plasma source.

In additional embodiments, the method further includes passing the RF signal through a matching network and a power splitter to distribute the RF signal to the one or more plasma sources. In further embodiments, the matching network includes a transmission line and one or more transmission line stubs having one or more movable grounding pins.

For one embodiment, a system to process a microelectronic workpiece is disclosed including a generator configured to output a radio frequency (RF) signal, a process chamber configured to have a pressure during operation of between 350 and 4000 Torr, and one or more plasma sources coupled to receive the RF signal and positioned within the process chamber to generate and apply plasma gasses to a microelectronic workpiece within the process chamber. In addition, the system is further configured to scan the one or more plasma sources across the microelectronic workpiece.

In additional embodiments, the microelectronic workpiece includes a semiconductor wafer. In further embodiments, the system includes a chuck within the process chamber configured to receive the microelectronic workpiece, and the chuck is configured to rotate the microelectronic workpiece with respect to the one or more plasma sources to scan the one or more plasma sources across the microelectronic workpiece.

In additional embodiments, the one or more plasma sources are a plurality of plasma sources connected together as an array of plasma sources. In further embodiments, the array of plasma sources are configured to be linearly moved with respect to the microelectronic workpiece to scan the plasma sources across the microelectronic workpiece. In still further embodiments, the system includes a chuck within the process chamber configured to receive the microelectronic workpiece, and the chuck is configured to rotate the microelectronic workpiece with respect to the array of plasma sources to scan the array of plasma sources across the microelectronic workpiece.

In additional embodiments, each of the one or more plasma source includes an outer conductor, an inner conductor, and a dielectric material positioned between the outer conductor and the inner conductor. In further embodiments, the system includes, for each plasma source, a ground connector connected to the outer conductor and the inner conductor at a first end of the plasma source and an RF input connector connected to the inner conductor, and the RF input connector is further configured to receive the RF signal to drive an electrode coupled to the inner conductor at a second end of the plasma source.

In additional embodiments, the system includes a matching network and a power splitter coupled between the generator and the one or more plasma sources to distribute the RF signal to the one or more plasma sources. In further embodiments, the matching network includes a transmission line and one or more transmission line stubs having one or more movable grounding pins.

It is noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Systems and related methods are disclosed for atmospheric plasma processing of microelectronic workpieces, such as semiconductor wafers. For disclosed embodiments, a radio frequency (RF) generator generates an RF signal that is distributed to one or more plasma sources within a process chamber. The process chamber has an atmospheric pressure between 350 to 4000 Torr. The plasma sources are then scanned across a microelectronic workpiece to apply plasma gasses generated by the plasma generators to the microelectronic workpiece. The plasma sources can be individually scanned and/or combined in arrays for scanning across the microelectronic workpiece. Linear and/or angular movement can be applied to the plasma sources and/or the microelectronic workpiece to provide the scanning operation. Additional features and variations can be implemented, if desired, and related systems and methods can be utilized, as well.

The embodiments and techniques described herein provide new systems and methods for atmospheric plasma processes for the manufacture of microelectronic workpieces, such as semiconductor wafers. Potential applications include etch processes, photoresist strip processes for semiconductor substrates, and/or other manufacturing processes. Atmospheric plasma sources can be scanned across the microelectronic workpieces to improve processing efficiencies. This movement can be implemented by moving the plasma sources, the microelectronic workpiece, or combinations of both. For example, the plasma sources can be installed or mounted on a track tool and then moved linearly and/or angularly with respect to the microelectronic workpiece. Further, the systems disclosed herein can be embodied in a relatively compact form by providing an array of plasma sources that are scanned over a stationary or rotating microelectronic workpiece, such as a semiconductor wafer. In addition, to improve efficiency for high frequency RF signals distributed to the plasma sources, a matching network and/or a power splitter can be used. One example frequency that can be used is 162 MHz, although other frequencies can be used as well. Systems disclosed herein also enable the use of corrosive gases (e.g., for metal etch) in addition to non-corrosive gases. For embodiments using corrosive gases, exposed surfaces inside the plasma sources and process chambers can be coated with a protective layer to prevent damage to the system. Example protective layers or coatings include nickel or yttria, although other protective materials can also be used. Further variations can also be implemented while still taking advantage of the atmospheric plasma processing techniques described herein.

Figure 1:
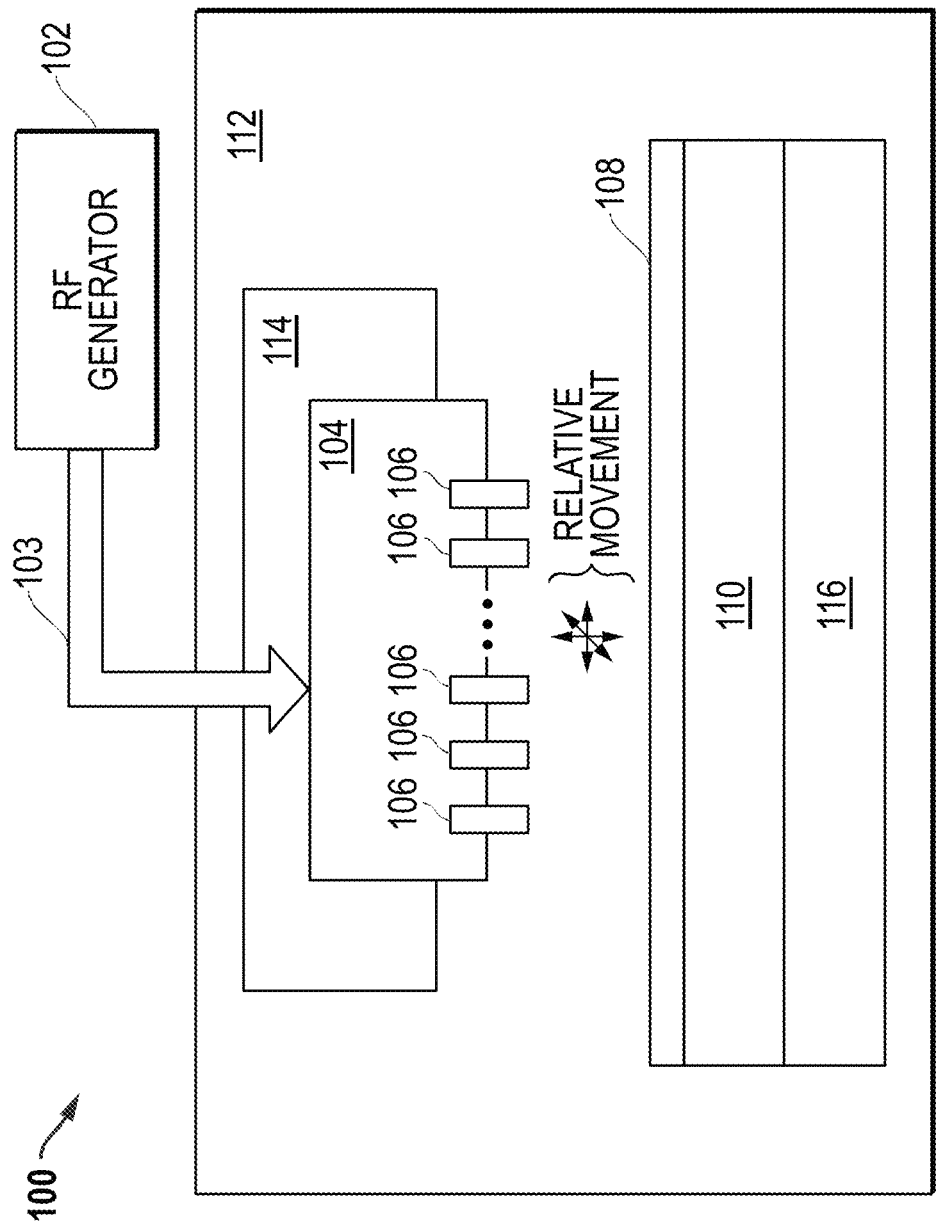
FIG. 1 is a block diagram of an example embodiment for a system for plasma processing of a microelectronic workpiece at atmospheric pressures using plasma sources.

FIG. 1 is a block diagram of an example embodiment for a system 100 for plasma processing of a microelectronic workpiece 108 at atmospheric pressures. A radio frequency (RF) generator 102 generates an RF signal 103, such as an RF signal having a high frequency of 50 MHz to 3 GHz or more. One or more plasma sources 106, such as an array 104 of plasma sources 106, are positioned within a process chamber 112, and the plasma sources 106 are coupled to receive the RF signal 103. The process chamber 112 operates at atmospheric pressures, such as pressures between 0.5 to 5.0 atmospheres (atm) or 350 and 4000 Torr. In addition to other components, the process chamber can include a chuck 110. The microelectronic workpiece 108 is coupled to the chuck 110 during plasma processing within the process chamber 112. It is noted that although multiple plasma sources 106 are preferred and shown in FIG. 1, the atmospheric plasma processing techniques described herein can also be used with a single plasma source 106 if desired for certain applications.

As described in more detail herein, the one or more plasma sources 106 are scanned across the microelectronic workpiece 108 during plasma processing. This scanning can be implemented by linear and/or angular movements of the plasma sources 106, linear and/or angular movements of the microelectronic workpiece 108, or combinations thereof. For one example embodiment, the plasma sources 106 are moved linearly with respect to the microelectronic workpiece 108, and the chuck 110 is moved angularly (e.g., rotated) with respect to the plasma sources 106, to provide the relative movement between the plasma sources 106 and the microelectronic workpiece 108. A scanner 114 can be coupled to the plasma sources 106 to provide the linear and/or angular movement of the plasma sources with respect to the microelectronic workpieces. For one example embodiment, the scanner 114 is a mount that is mechanically controlled by a controller to move according to one or more scanning algorithms. Similarly, a scanner 116 can be coupled to the chuck 110 to provide the linear and/or angular movement of the microelectronic workpieces. For one example embodiment, the scanner 116 is a mount that is mechanically rotated by a controller to move according to one or more scanning algorithms. The scanning algorithms for the scanners 114/116 can be program instructions stored in a computer readable medium that are executed by the controller to implement the desired scanning of the plasma sources 106 across the microelectronic workpiece.

As described above, plasma processing of microelectronic workpieces, such as semiconductor wafers, is typically done at low pressures. Low pressure processing, however, requires expensive vacuum equipment. With techniques and embodiments described herein, plasma processing is performed at atmospheric pressure(s) thereby providing large reductions in cost and size of production equipment. Other benefits include reduced cycle time by not having to depressurize and re-pressurize process chambers between sets of microelectronic workpieces (e.g., semiconductor wafers or substrates) being processed within the production equipment. In addition, an atmospheric plasma etch described herein can be a substituted for wet etch for some applications. Using the disclosed embodiments, therefore, overall process flow can be streamlined by reducing or eliminating wait times for etch processing due to depressurizing/pressurizing requirements.

Conventional low-pressure plasma processing also requires microelectronic workpieces to be transported between processing tools or systems such as between a coater-developer tool where photoresist layers are applied/developed and an etch tool where plasma processing is conducted. In contrast, the atmospheric plasma processing described here can be combined on a common platform with a coater-developer to reduce or eliminate variability caused by exposure to air or equipment drift while microelectronic workpieces are in a processing queue within a fabrication facility or production line. For example, a single process chamber at atmospheric pressures can be used to form photoresist layers and then used to perform a plasma process, such as a plasma etch process, without requiring removal of the microelectronic workpiece. It is further noted that the systems described herein for atmospheric plasma processing can be embodied as a stand-alone system or as a module in another system, such as a module within a coater-developer (track) tool. Other variations and implementations can also be used while still taking advantage of the atmospheric plasma processing techniques described herein.

Various plasma sources 106 can be used with system 100 to provide the atmospheric plasma processing described herein. Example embodiments for atmospheric plasma sources are described in U.S. Patent Application Number 2014/0262789, which is hereby incorporated by reference in its entirety. Other implementations can also be used.

Figures 2, 3:
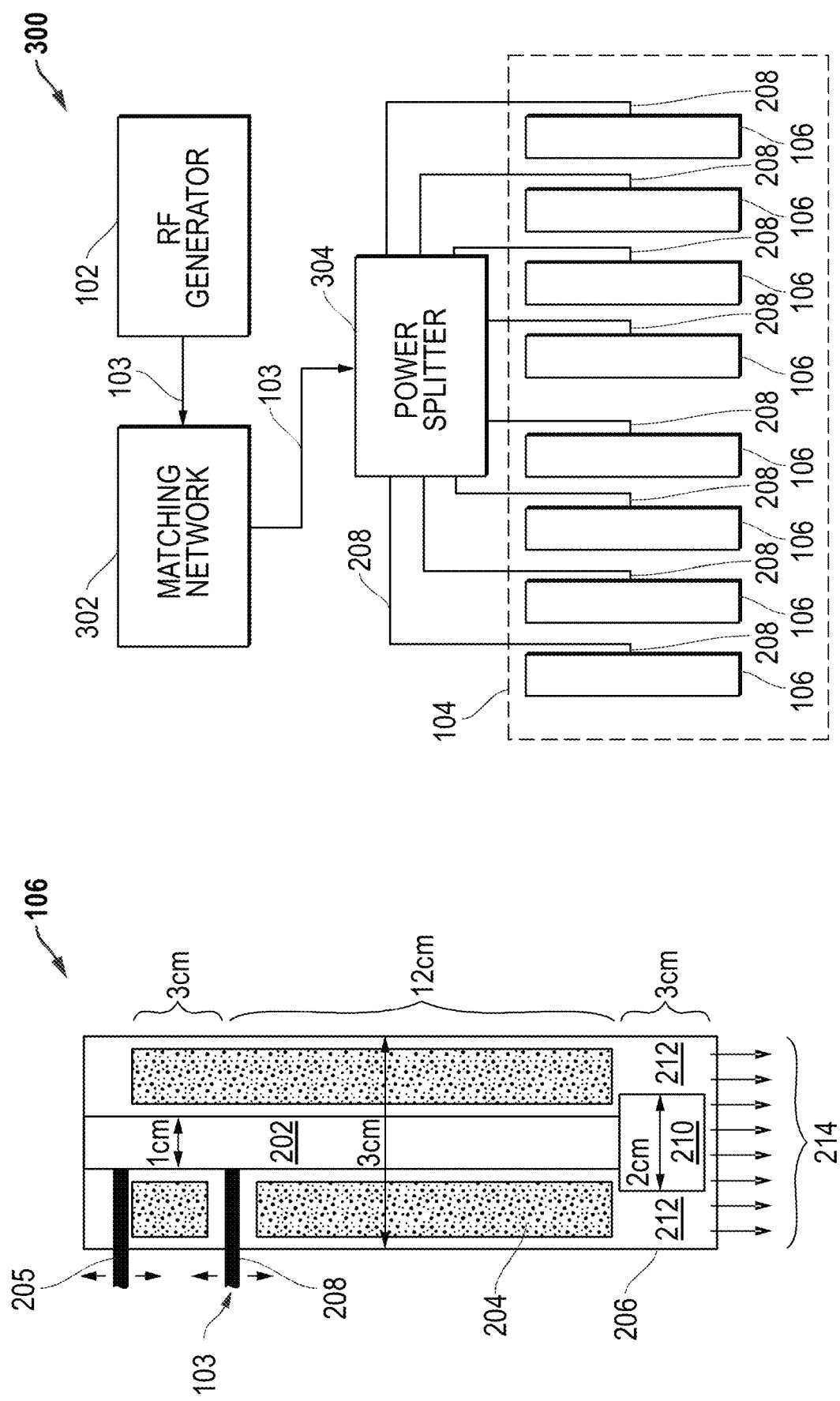
FIG. 2 is an example embodiment for a cross-section view of a plasma source that can be used for the embodiment of FIG. 1.
FIG. 3 is a block diagram of an example embodiment including a matching network and a power splitter to distribute radio frequency signals to an array of plasma sources.

FIG. 2 is an example embodiment for a cross-section view (not to scale) of a plasma source 106 based upon the plasma sources described in U.S. Patent Application Number 2014/0262789. The plasma source 106 includes a coaxial transmission line (TL) having an outer conductor 206 and an inner conductor 202. The outer conductor 206 and the inner conductor 202 are connected to ground through ground connector 205 at one end for the plasma source 106. This ground connector 205 preferably includes a mechanism, such as an integrated or built-in mechanism, to allow for the sliding of the ground connector 205 along the plasma source 106. This sliding adjustment for the ground connector 205 allows for a range of impedance tuning by changing the effective lengths of the transmission line (TL) created by plasma source 106. Good contact with the outer conductor 206 and the inner conductor 202 is also maintained throughout the sliding movement, and adjustments can be made when the plasma source 106 is active or when inactive. The sliding mechanism for the ground connector 205 can be implemented, for example, similar to the grounding pins 606 described with respect to FIG. 6 below.

The inner conductor 202 is also coupled to an electrode 210 at the other end for the plasma source 106. During operation, the plasma source 106 generates plasma gases 214 extending from this second end of the plasma source 106 adjacent the electrode 210. For the example embodiment depicted, the electrode 210 is a cylinder that has a larger diameter than the inner conductor 202. This electrode 210 helps breakdown occur in the air gap 212 between the grounded outer conductor 206 and the electrode 210 which is driven with the RF signal 103 applied to the inner conductor 202 through an RF input connector 208.

A dielectric material 204 is positioned between the outer conductor 206 and the inner conductor 202. This dielectric material 204 can be selected based upon the size requirements for the plasma source 106 for particular applications. For example, higher dielectric materials reduce the necessary length of the coaxial lines as the dielectric constant is proportional to the wavelength of the RF signal 103 delivered to the plasma source 106.

The RF input connector 208 for the plasma source 106 is coupled to the inner conductor 202 while being isolated from the outer conductor 206. In operation, the RF input connector 208 is also coupled to receive the RF signal 103 from the RF generator 102 as shown in FIG. 1 above. This RF input connector 208 preferably includes a mechanism, such as an integrated or built-in mechanism, to allow for the sliding of the RF input connector 208 along the plasma source 106. This sliding adjustment for the RF input connector 208 allows for a range of impedance tuning by changing the effective lengths of the transmission line (TL) created by plasma source 106. Good contact with the inner conductor 202 is also maintained throughout the sliding movement, and adjustments can be made when the plasma source 106 is active or when inactive. The sliding mechanism for the RF input connector 208 can be implemented, for example, similar to the grounding pins 606 described with respect to FIG. 6 below.

With respect to the sizes shown for the example embodiment depicted in FIG. 2, it is assumed that the RF signal 103 applied to the RF input connector 208 is output at 162 MHz and that alumina is used as the dielectric material 204. Alumina has a dielectric constant ($\epsilon$) of 9.5 (i.e., $\epsilon$=9.5). This results in an overall length for the plasma source 106 of 18 cm. The top portion between the RF input connector 208 and the connection to ground connector 205 is 3 cm. The middle portion between the electrode 210 and the RF input connector 208 is 12 cm. The electrode 210 itself is 3 cm. Further, the diameter of the outer conductor 206 is 3 cm, and the diameter of the inner conductor 202 is 1 cm. Other materials and sizes can also be used while still taking advantage of the atmospheric plasma processing techniques described herein.

To allow for airflow through the plasma source 106, gaps or voids are included between the inner conductor 202 and the dielectric material 204 along the length of the plasma source 106. During operation, gas flows within the plasma source 106 between the inner conductor 202 and outer conductor 206 as gas is fed perpendicular to the length of the plasma source 106. For embodiments with a solid material as the dielectric material 204, gas can be input where the electrode 210 and the inner conductor 202 connect as stable gas flow can be achieved in the relatively short distance to the end of the plasma source 106 in order to sustain the plasma gases 214 outside of the plasma source 106. Optionally, the outer diameter of such a solid dielectric material can be reduced by a relatively small amount to allow the gas inlet to be positioned closer to the RF input connector 208 and to allow gas to flow between the dielectric material 204 and the outer conductor 206. Various gases can be used to create plasma, including corrosive gasses and non-corrosive gases. In embodiments configured for use with corrosive feed gases, surfaces in contact with the feed gas benefit by being coated with a layer of a protective material, such as yttria or nickel plating or other protective materials.

As described above, a one or more plasma sources 106 can be used for the disclosed embodiments. However, embodiments preferably use an array 104 of plasma sources 106 to improve plasma processing and reduce overall process time. This array 104 can have any number of plasma sources 106 as supported by the RF generator 102 and related distribution components. For example, the RF generator 102 will preferably need to supply sufficient power to sustain each of the plasma sources 106 included within the array 104.

FIG. 3 is a block diagram of an example embodiment 300 including a matching network 302 and a power splitter 304 used along with an RF generator 102 to power an array 104 of eight different plasma sources 106. For this example embodiment 300, the plasma sources 106 receive the RF signal 103 in parallel using the power splitter 304 to drive the RF input connector 208 for each of the plasma sources 106. The power splitter 304 splits power from a single input line to the different plasma sources 106 to be used for this particular application, which is an array of eight (8) plasma sources 106 for the example embodiment 300. This power splitter 304 can be implemented with a simple design that includes a single RF powered thick bar that has a grounded sheath around it. From the powered bar, N number of pins or rods extend from the bar through the grounded sheath while remaining electrically isolated from the ground. The number N can be set to match the number of plasma sources 106 in the array 104. These pins or rods can then then be connected to cables that are in turn connected to the individual RF input connectors 208 for the different plasma sources 106. Combining multiple plasma sources 106 in parallel, however, can cause large shifts in impedances that can prevent the overall system from being matched between the RF generator 102 and the power splitter 304. As such, the matching network 302 can be used to achieve matched impedances and thereby improve efficiency for distribution of the RF signal 103 through the matching network 302 to the power splitter 304.

It is noted that microelectronic workpieces, such as semiconductor wafers, are often between about 3 cm to about 30 cm or more in diameter. As seen with respect to the embodiment of FIG. 2, the plasma source 106 generates a plasma gases 214 that is relatively small (e.g., about 3 cm across the end of the outer conductor 206) as compared to the larger sized wafers (e.g., 15 cm or more in diameter). As such, each of the plasma sources 106 in an array 104 as shown with respect to FIGS. 1 and 3 only interacts with a small area of a wafer being processed at any given time. Because uniformity is desired in processing of microelectronic workpieces, scanning of plasma sources 106 across the microelectronic workpiece 108 is used to achieve better uniformity for the application of the plasma gases 214. Various techniques can be used to provide the relevant movement for this scanning, and various movement patterns, movement rates, etc. can be used for the relevant movement of the plasma sources 106 with respect to the microelectronic workpiece 108. For example, movements for this scanning can range from individually moving each plasma source 106, to moving groups of plasma sources 106, to moving all of the plasma sources 106 within an array 104 as one single set of movable plasma sources 106. As described above with respect to FIG. 1, scanners 114/116 can be used to provide desired movements according to one or more scanning algorithms.

Figure 4:
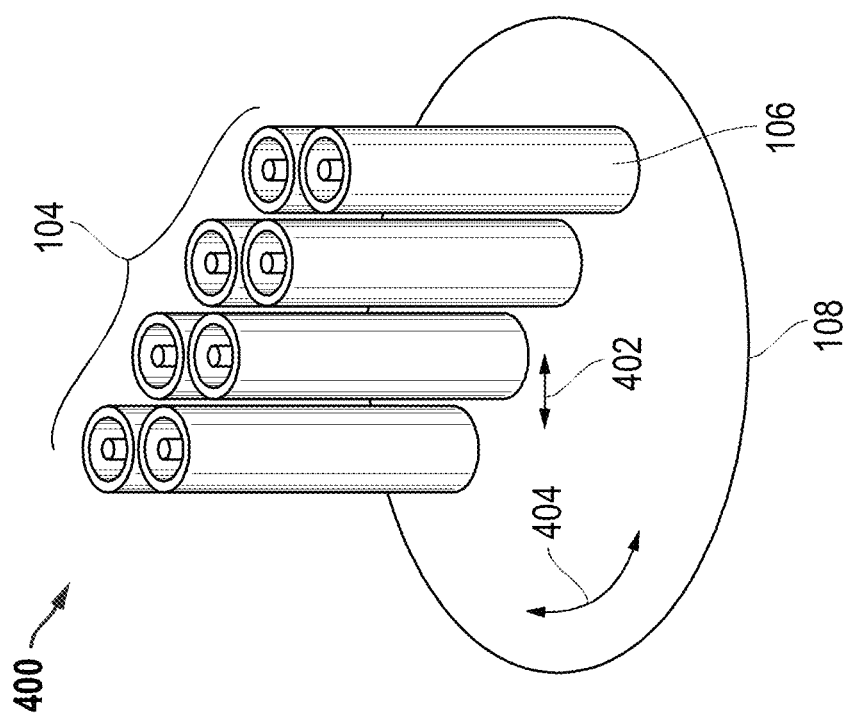
FIG. 4 is a diagram of an example embodiment for scanning of plasma sources across a microelectronic workpiece.

FIG. 4 is a diagram of an example embodiment 400 for scanning of one or more plasma sources 106 across a microelectronic workpiece 108. For this example embodiment 400, the array 104 of plasma sources 106 is linearly moved in one dimension (as represented by arrow 402) while the microelectronic workpiece is rotated (as represented by arrow 404).

Figure 5:
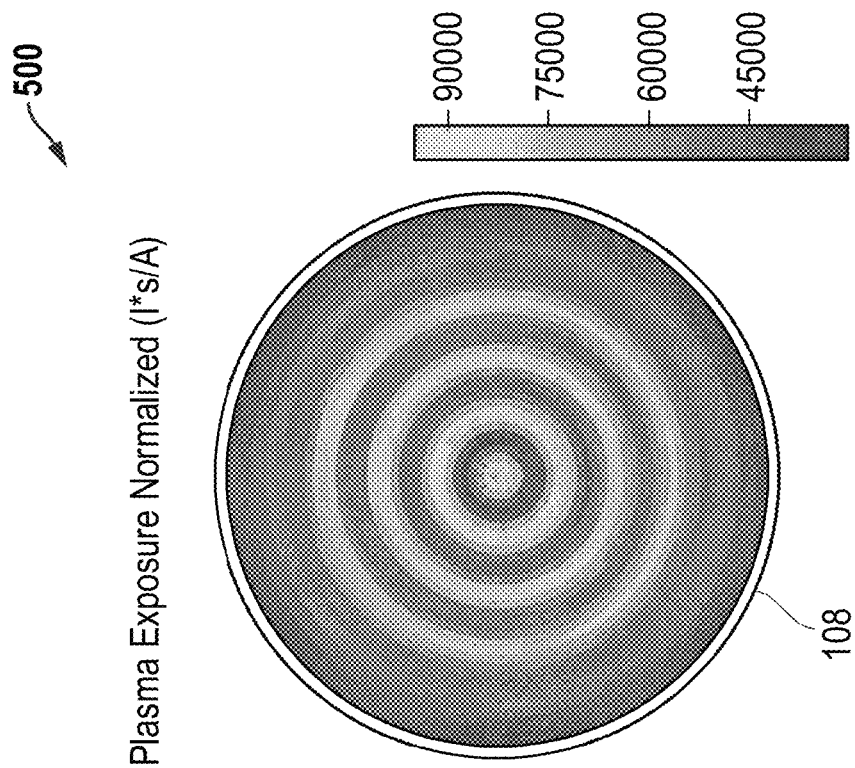
FIG. 5 provides a representation for surface exposure achieved for the example embodiment of FIG. 4.

FIG. 5 provides a representation 500 for surface exposure achieved for the example embodiment of FIG. 4. For this example as indicated above, a simple scanning algorithm was used where an array of eight (8) plasma sources 106 was moved in the x-direction above a rotating microelectronic workpiece 108. A reasonable degree of exposure uniformity was achieved for the surface of the microelectronic workpiece 108 as shown in FIG. 5, which depicts plasma exposure that has been normalized to show relative intensity. For example, relative intensity can be calculated by multiplying the intensity (I) of the plasma by the time interval (s) for exposure and then dividing by the cell area (A) for a give location on the microelectronic workpiece. Applying one or more scanning algorithms helps to achieve uniformity across the microelectronic workpiece 108 and thereby compensate for any non-uniformities, for example, non-uniformities based on configuration of the plasma sources 106. Additional or different relative movements can be used to improve uniformity for particular implementations.

It is further noted that the RF signals 103 generated by the RF generator 102 in FIGS. 1 and 3 are desirably at high frequencies, such as 162 MHz or more generally between about 50 MHz to 3 GHz or more. At such high frequencies, matching networks 302, as shown in FIG. 3, can be difficult to achieve. This is so because variable capacitors are typically not available at these high frequencies, and other techniques may be needed to generate the matching network 302.

Figure 6:
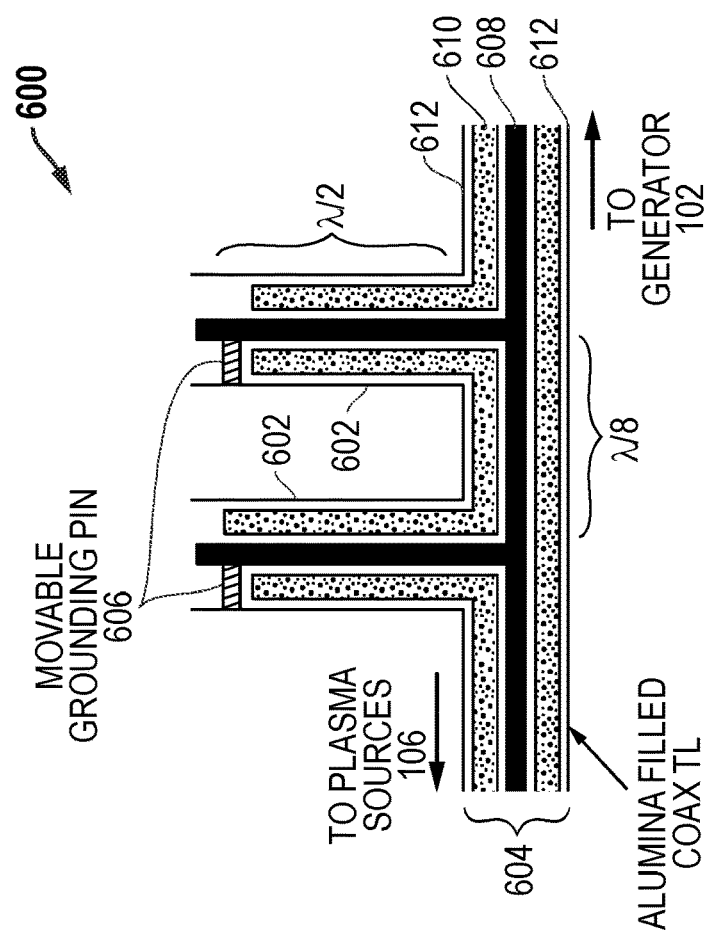
FIG. 6 is a diagram of an example embodiment for a matching network that uses a transmission line and two transmission line stubs.

FIG. 6 is a diagram of an example embodiment 600 for a matching network that can be used for matching network 302 shown in FIG. 3 and that uses a transmission line (TL) 604 and TL stubs 602 that operate together to form a double stub tuner. For this example embodiment 600, the double stub tuner includes two grounded TL stubs 602 of variable lengths that are positioned in parallel to a main TL 604 that is coupled to the RF generator 102 and to the plasma sources 106. The TL 604 and TL stubs 602 can be a coaxial TL including an outer conductor 612 and an inner conductor 608 along with a dielectric material 610. A high dielectric material is preferred, such as alumina, in order to reduce the size of the matching network needed, although other materials can also be used.

The two TL stubs 602 are separated by a distance of $\lambda/8$, where $\lambda$ is the wavelength determined in part by the dielectric material 610 in the TL 604 and the frequency of the RF signal 103 being supplied by the RF generator 102. A sliding grounding pins 606 is used with respect to each TL stub 602 to adjust the effective length of the overall matching network. If the dielectric material 610 is a solid material, slits can be optionally cut into the dielectric material 610 to allow movement of the grounding pins 606. If the dielectric material 610 is a fluid material, the grounding pins 606 can slide freely throughout the dielectric material 610. The length of the TL stubs 602 will vary between 0 and λ/2, as determined by the positions of the grounding pins 606, in order to achieve the largest possible tuning space for the matching network 302 shown for the example embodiment in FIG. 6. It is also noted that the grounding pins 606 can be adjusted independently if desired to provide for different lengths between the two TL stubs 602. Other variations could also be implemented.

Figure 7:
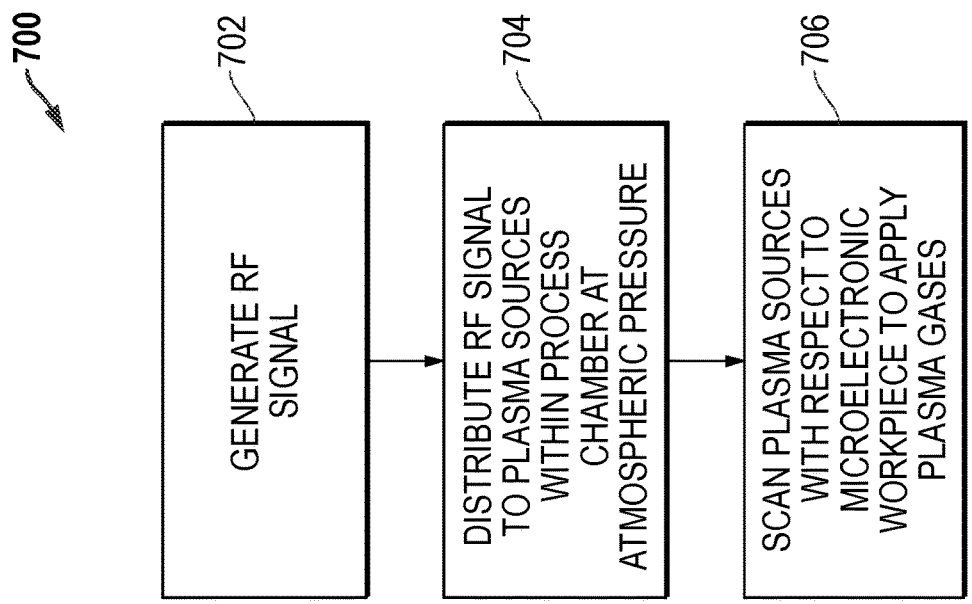
FIG. 7 is a process diagram of an example embodiment for atmospheric plasma processing of a microelectronic workpiece at atmospheric pressures using plasma sources.

FIG. 7 is a process diagram of an example embodiment 700 for atmospheric plasma processing of a microelectronic workpiece 108 at atmospheric pressures using plasma sources 106. In block 702, an RF signal 103 is generated. In block 704, the RF signal 103 is distributed to plasma sources 106 within a process chamber 112 at atmospheric pressure. The atmospheric pressure, for example, is between 350 to 4000 Torr. In block 706, the plasma sources 106 are scanned across microelectronic workpiece 108 to apply plasma gases 214 to the microelectronic workpiece 108. Different and/or additional process steps can also be implemented.

Those skilled in the art will also understand that there can be many variations made to the operations of the techniques explained above while still achieving the same objectives of the disclosed embodiments. Such variations are intended to be covered by the scope of this disclosure. As such, the foregoing descriptions of embodiments of the invention are not intended to be limiting. Further, in the preceding description, various details have been set forth for processing system, components, and processes used therein. It should be understood, however, that techniques described herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described above as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

It is noted that the order of discussion of different processing steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the disclosed embodiments can be embodied and viewed in many different ways.

It is further noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in therm etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate including a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for annealing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A system to process a microelectronic workpiece, comprising:
    a generator configured to output a radio frequency (RF) signal;
    a process chamber configured to have a pressure during operation of between 350 and 4000 Torr; and
    one or more plasma sources coupled to receive the RF signal and positioned within the process chamber to generate and apply plasma gases to a microelectronic workpiece within the process chamber,
    a matching network and a power splitter coupled between the generator and the one or more plasma sources to distribute the RF signal to the one or more plasma sources,
    wherein the matching network comprises a transmission line and one or more transmission line stubs having one or more movable grounding pins that are configured to adjust an effective length of the matching network by sliding freely through a first dielectric material of the one or more transmission line stubs,
    wherein each of the one or more plasma sources further comprises an outer conductor, an inner conductor, and a second dielectric material positioned between the outer conductor and the inner conductor, wherein the outer conductor, the inner conductor, and the second dielectric material are fixed relative to one another and together constitute a coaxial transmission line,
    wherein each of the one or more plasma sources comprises a movable ground connector connected to the outer conductor and the inner conductor at a first end of the plasma source, and the movable ground connector is configured to slide along the plasma source and tune an impedance by changing an effective length of a transmission line created by the plasma source,
    wherein each of the one or more plasma sources further comprises an RF input connector connected to the inner conductor, the RF input connector being configured to receive the RF signal to drive an electrode coupled to the inner conductor at a second end of the plasma source, and the RF input connector is a movable RF input connector that is configured to slide along the plasma source and tune the impedance by changing the effective length of the transmission line created by the plasma source,
    wherein the movable ground connector and the RF input connector are positioned along a length direction of the outer conductor of the plasma source and are configured to slide linearly along and parallel to the length direction of the outer conductor relative to each other along the plasma source to tune the impedance,
    wherein the movable ground connector and the RF input connector are configured to move independently from each other,
    wherein the system is further configured to scan the one or more plasma sources across the microelectronic workpiece,
    wherein a distance between the RF input connector and the movable ground connector is adjustable, and the distance is adjusted only linearly along the length direction of the outer conductor,
    wherein the second dielectric material is disposed between the movable ground connector at the first end of the plasma source and the RF input connector, and is disposed further between the RF input connector and the electrode at the second end of the plasma source, wherein the electrode is disposed between the end of the second dielectric material and the second end of the plasma source, and wherein the second dielectric material is composed of a solid material including at least alumina.

2. The system of claim 1, wherein the microelectronic workpiece comprises a semiconductor wafer.

3. The system of claim 1, further comprising a chuck within the process chamber configured to receive the microelectronic workpiece, the chuck being configured to rotate the microelectronic workpiece with respect to the one or more plasma sources to scan the one or more plasma sources across the microelectronic workpiece.

4. The system of claim 1, wherein the one or more plasma sources comprise a plurality of plasma sources connected together as an array of plasma sources.

5. The system of claim 4, wherein the array of plasma sources are configured to be linearly moved with respect to the microelectronic workpiece to scan the plasma sources across the microelectronic workpiece.

6. The system of claim 5, further comprising a chuck within the process chamber configured to receive the microelectronic workpiece, the chuck being configured to rotate the microelectronic workpiece with respect to the array of plasma sources to scan the array of plasma sources across the microelectronic workpiece.

* * * * *

UNITED STATES PATENT AND TRADEMARK OFFICE
CERTIFICATE OF CORRECTION

PATENT NO. : 11,049,700 B2
APPLICATION NO. : 15/719294
DATED : June 29, 2021
INVENTOR(S) : deVilliers et al.

Page 1 of 1

It is certified that error appears in the above-identified patent and that said Letters Patent is hereby corrected as shown below:

In the Claims

In Column 12, Claim 2, Line 37, delete "water." and insert -- wafer. --, therefor.

Signed and Sealed this
Fifteenth Day of March, 2022

Drew Hirshfeld
*Performing the Functions and Duties of the*
*Under Secretary of Commerce for Intellectual Property and*
*Director of the United States Patent and Trademark Office*